US008601682B2

(12) United States Patent
Grajcar

(10) Patent No.: US 8,601,682 B2
(45) Date of Patent: Dec. 10, 2013

(54) PROCESS OF MANUFACTURING A LIGHT

(75) Inventor: Zdenko Grajcar, Crystal, MN (US)

(73) Assignee: Nexxus Lighting, Incorporated, Charlotte, NC (US)

(*) Notice: Subject to any disclaimer, the term of this patent is extended or adjusted under 35 U.S.C. 154(b) by 1126 days.

(21) Appl. No.: 12/557,222

(22) Filed: Sep. 10, 2009
(Under 37 CFR 1.47)

(65) Prior Publication Data
US 2010/0212149 A1    Aug. 26, 2010

Related U.S. Application Data

(60) Provisional application No. 61/096,273, filed on Sep. 11, 2008.

(51) Int. Cl.
*H05K 3/34*    (2006.01)

(52) U.S. Cl.
USPC ............................ 29/840; 29/832; 362/373

(58) Field of Classification Search
USPC ............ 29/830–832, 840, 846, 852; 361/792, 361/803; 362/294, 373, 800
See application file for complete search history.

(56) References Cited

U.S. PATENT DOCUMENTS

| 5,036,431 | A  | * | 7/1991  | Adachi et al. ............... 361/792 |
| 6,787,999 | B2 |   | 9/2004  | Stimac et al. |
| 6,799,864 | B2 |   | 10/2004 | Bohler et al. |
| 7,198,386 | B2 | * | 4/2007  | Zampini et al. ............. 362/373 |
| 7,540,761 | B2 |   | 6/2009  | Weber et al. |
| 7,628,513 | B2 |   | 12/2009 | Chiu |
| 7,658,511 | B2 |   | 2/2010  | Sugiyama et al. |
| 2004/0052077 | A1 | * | 3/2004 | Shih ........................ 362/294 |
| 2004/0066142 | A1 |   | 4/2004 | Stimac et al. |
| 2005/0073244 | A1 |   | 4/2005 | Chou et al. |
| 2005/0083698 | A1 |   | 4/2005 | Zampini et al. |
| 2005/0111234 | A1 |   | 5/2005 | Martin et al. |
| 2005/0174780 | A1 |   | 8/2005 | Park |
| 2006/0018099 | A1 |   | 1/2006 | Chen |
| 2007/0083698 | A1 |   | 4/2007 | Gonzalez et al. |

(Continued)

FOREIGN PATENT DOCUMENTS

| EP | 1 594 170 A2 | 11/2005 |
| EP | 1 840 450 A1 | 10/2007 |

(Continued)

OTHER PUBLICATIONS

Notification of Transmittal of the International Search Report and the Written Opinion of the International Searching Authority, or the Declaration, Written Opinion of the International Searching Authority, and International Search Report all mailed Jun. 30, 2009 for PCT Application PCT/US2008/084089.

Notification of Transmittal of the International Search Report and the Written Opinion of the International Searching Authority, or the Declaration, Written Opinion of the International Searching Authority, and International Search Report all mailed Jun. 30, 2009 for PCT Application PCT/US2008/084091.

(Continued)

*Primary Examiner* — Donghai D. Nguyen
(74) *Attorney, Agent, or Firm* — Baker & Hostetler LLP

(57) ABSTRACT

A light circuit manufacturing process includes forming a palletized driver PCB board having a plurality of driver PCBs, forming a plurality of power PCBs on a palletized surface, forming slots in the driver PCBs, forming holes in the power PCBs, aligning both the power PCB palletization and the driver PCB palletization using reference holes such that the edges of each extend further in one direction or the other, and inserting thermal tabs into both the power PCB and the driver PCB.

6 Claims, 16 Drawing Sheets

(56) References Cited

U.S. PATENT DOCUMENTS

2007/0230186 A1 10/2007 Chien
2009/0141500 A1 6/2009 Peng
2010/0046223 A1 2/2010 Li et al.

FOREIGN PATENT DOCUMENTS

| | | |
|---|---|---|
| JP | 2003-178602 | 6/2003 |
| JP | 2005-276956 | 10/2005 |
| JP | 2007-048638 | 2/2007 |
| JP | 2008-199011 | 8/2008 |
| KR | 20-0302769 | 2/2003 |
| KR | 10-0767738 | 10/2007 |

OTHER PUBLICATIONS

Notification of Transmittal of the International Search Report and the Written Opinion of the International Searching Authority, or the Declaration, Written Opinion of the International Searching Authority, and International Search Report all mailed Jun. 30, 2009 for PCT Application PCT/US2008/084094.

Notification of Transmittal of the International Search Report and the Written Opinion of the international Searching Authority, or the Declaration, Written Opinion of the International Searching Authority, and International Search Report, from PCT Application PCT/US2009/056520, all mailed Feb. 26, 2010.

\* cited by examiner

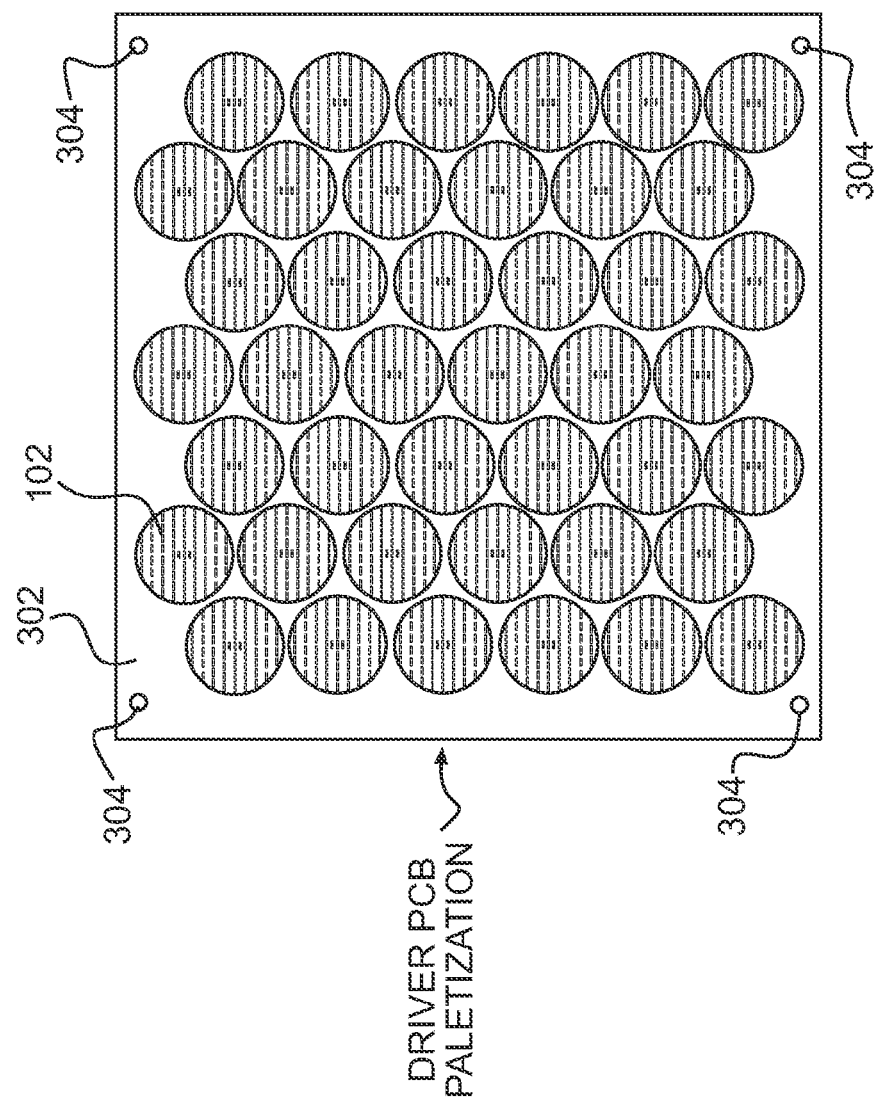
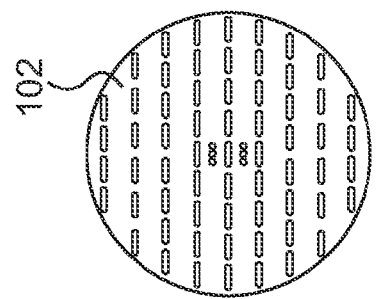

REFERENCE HOLE 504

POWER PCB PALETIZATION 502

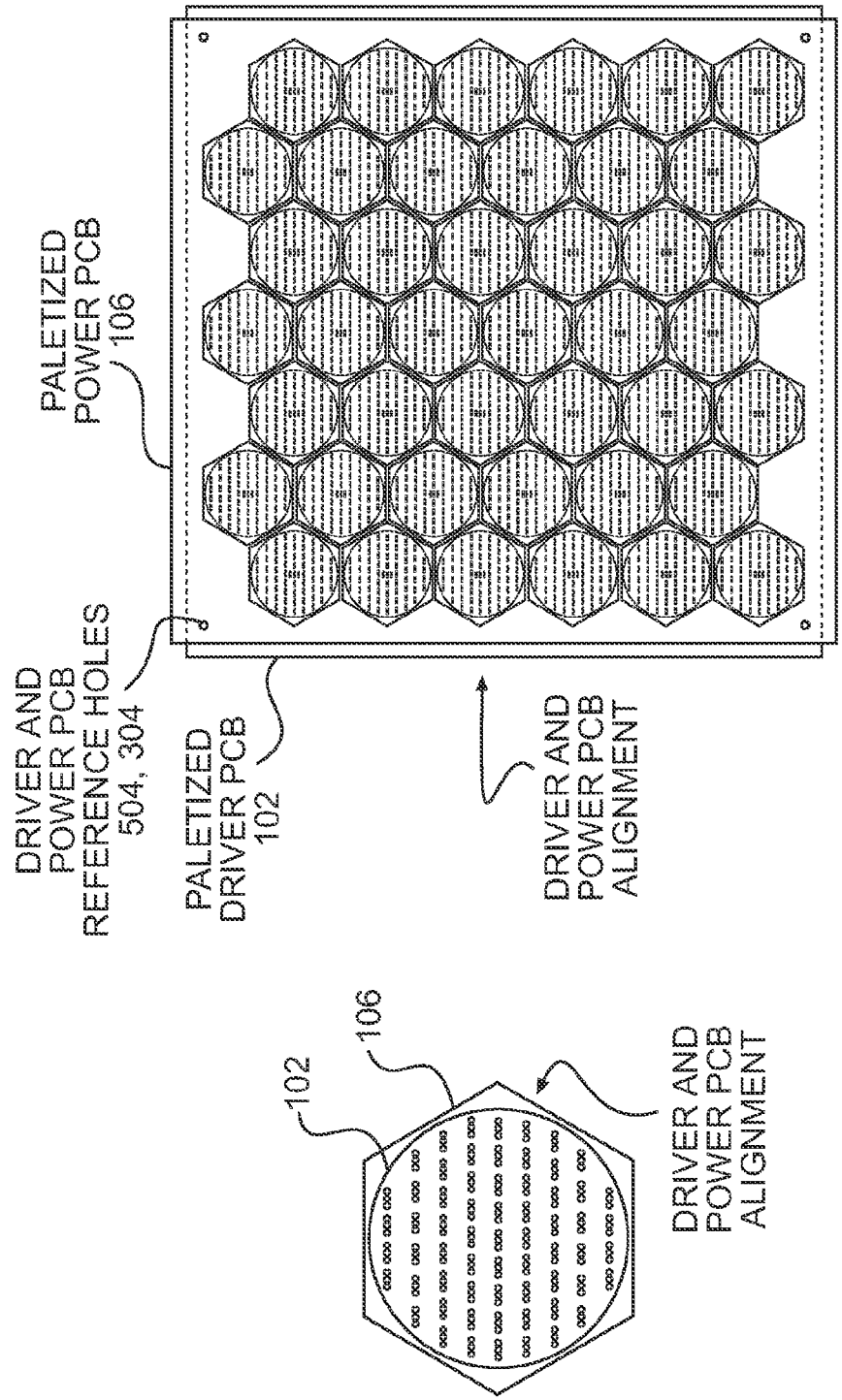

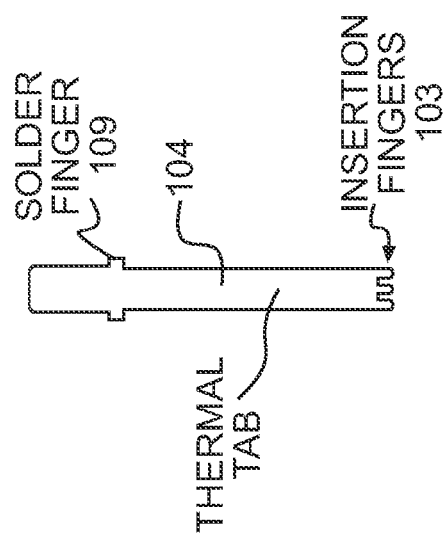
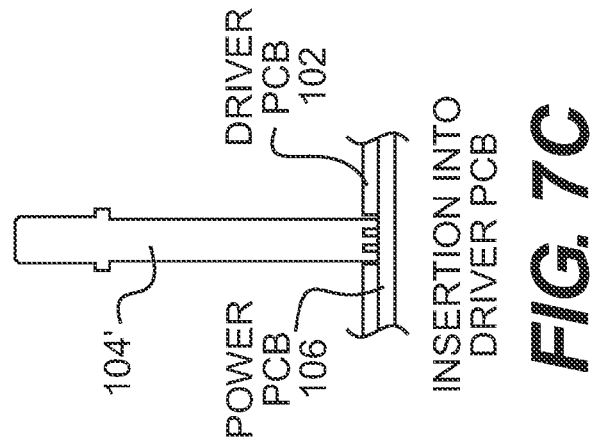
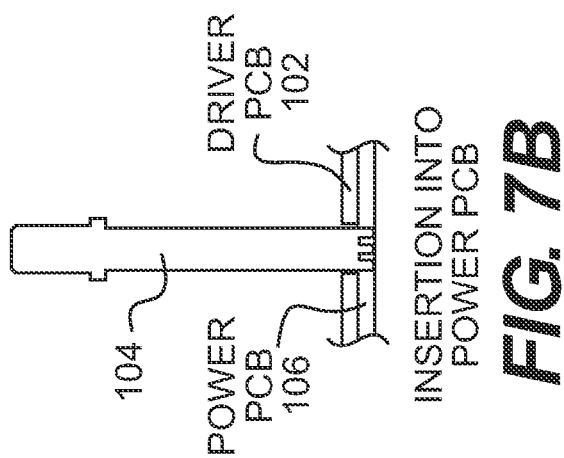

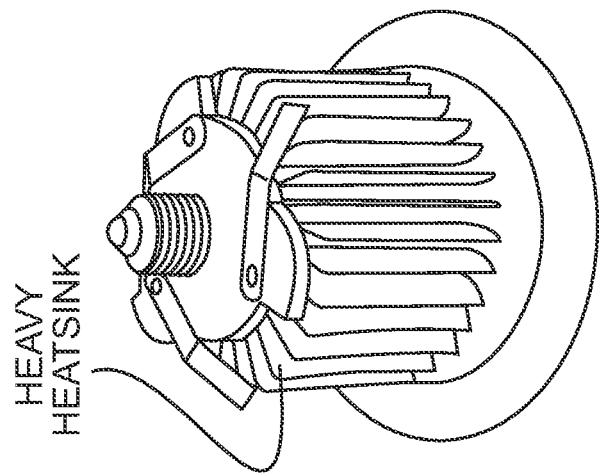
FIG. 16C *PRIOR ART*
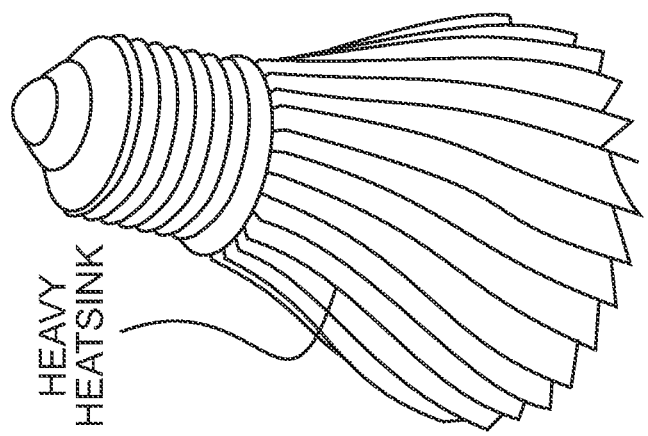
FIG. 16B *PRIOR ART*
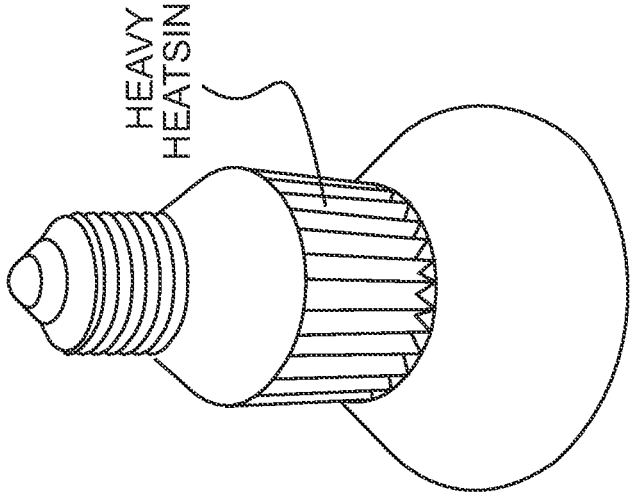
FIG. 16A *PRIOR ART*

PROCESS OF MANUFACTURING A LIGHT

CROSS REFERENCE TO RELATED APPLICATIONS

This application claims benefit of U.S. Provisional Application No. 61/096,273, filed Sep. 11, 2008, entitled LIGHT AND PROCESS OF MANUFACTURING A LIGHT, the disclosure of which is incorporated by reference herein.

BACKGROUND OF THE INVENTION

1. Field of the Invention

The invention is directed generally to a light and a process of manufacturing a light and, more particularly, to manufacturing a light in a more automated fashion that results in reduced costs and/or a light having improved construction that results in reduced use of materials, improved cooling and the like.

2. Related Art

Some alternatives to incandescent lighting are becoming more and more popular due to their increased light output at a reduced energy cost. For example florescent lighting has become popular, however florescent lights are typically expensive to manufacture and also include in their structure dangerous chemicals such as mercury. This makes the choice of florescent bulbs less attractive, but nevertheless they have gained popularity due to their low energy use compared to a standard incandescent bulb and the lack of a low-cost alternative.

Gaining popularity are other light generating types such as light emitting diodes (LED). However to date no effective and efficient way of manufacturing has made these other types of light attractive to the general public. For example, typically LED light bulbs require large and expensive cooling arrangements and a complex structure to attach the LED light bulbs to the cooling arrangements as shown in, for example, the three prior art devices shown in FIG. 16. These arrangements typically may include thermal grease, mechanical fasteners such as screws, heavy heat sinks, cooling fins, complex wiring, metal PCBs, and the like. Such arrangements increase the cost of manufacturing including increases in labor to manufacture the LED light bulbs and also increases in the material costs involved with manufacturing the LED light bulbs with the use such as heat sinks, mechanical fasteners, or the like.

Because LED light bulbs provide an increased amount of light at a very low energy usage and do not contain any dangerous chemicals that would be harsh to the environment, there is a need for a process for manufacturing a LED light that provides the necessary cooling without the great materials costs, that is easily manufactured in an automated fashion, and so on.

SUMMARY OF THE INVENTION

The invention meets the foregoing need and provides a manufacturing process for other types of light generating types such as LED lights that use a reduced amount of materials, have an arrangement that can be more easily manufactured in an automated fashion and that furthermore include other advantages apparent from the discussion herein.

Accordingly, in one aspect of the invention a light circuit manufacturing process includes forming a palletized driver PCB board having a plurality of driver PCBs, forming a plurality of power PCBs on a palletized surface, forming slots in the driver PCBs, forming holes in the power PCBs, aligning both the power PCB palletization and the driver PCB palletization using reference holes such that the edges of each extend further in one direction or the other, and inserting at least one thermal tab into both the power PCB and the driver PCB.

In another aspect, a LED light circuit manufacturing process includes forming a palletized driver PCB board having a plurality of driver PCBs, forming a plurality of power PCBs on a palletized surface, forming slots in the driver PCBs, forming holes in the power PCBs, aligning both the power PCB palletization and the driver PCB palletization using reference holes such that the edges of each extend further in one direction or the other, and inserting at least one thermal tab into both the power PCB and the driver PCB.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings:

FIGS. 3A and 3B show another possible step of the process performed according to the principles of the invention;

FIGS. 6A and 6B show another possible step of the process performed according to the principles of the invention;

FIGS. 7A, 7B, 7C show other possible steps of the process performed according to the principles of the invention;

FIG. 16 shows three prior art devices.

DETAILED DESCRIPTION OF THE INVENTION

Figure 1:
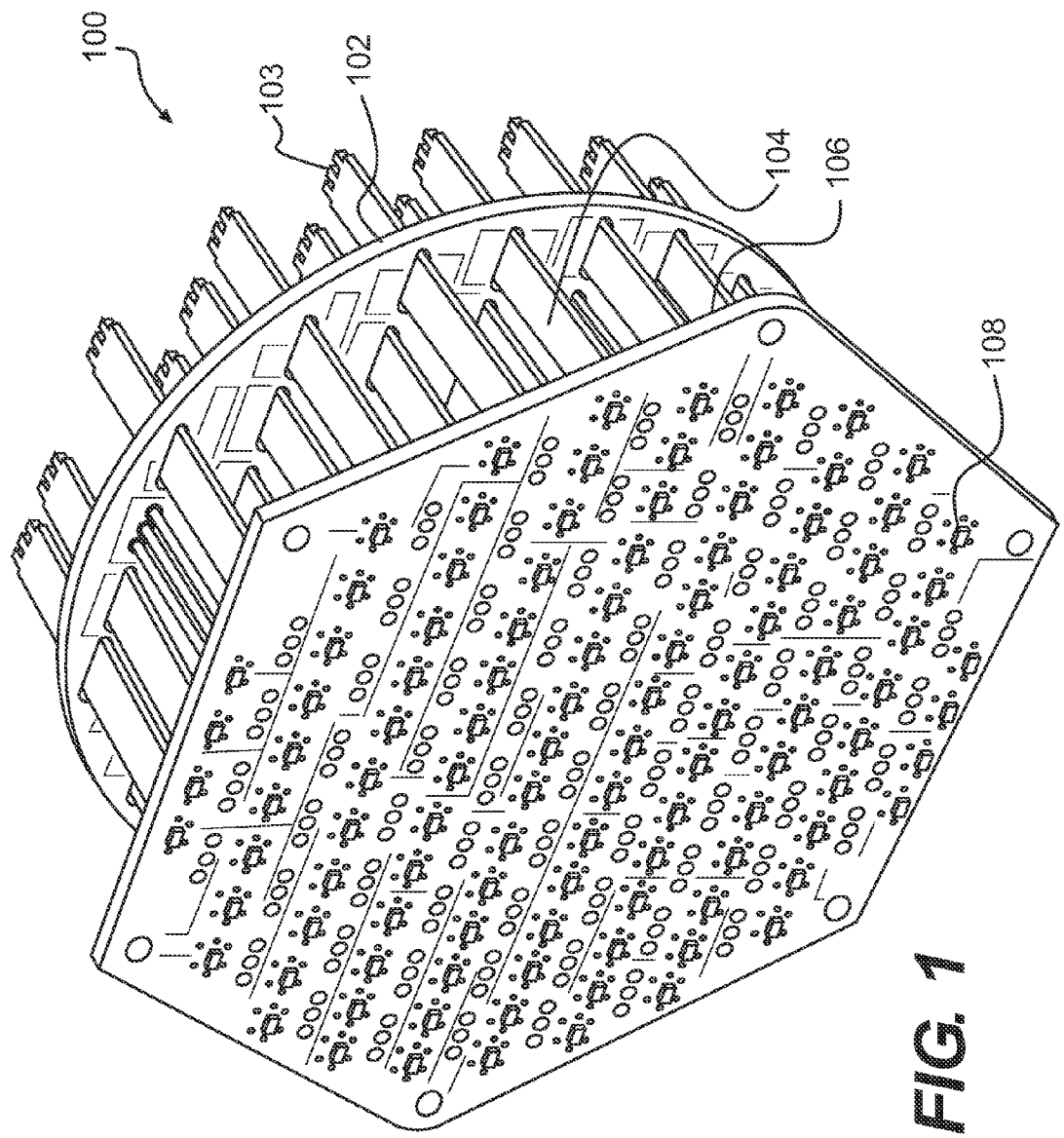
FIG. 1 shows a LED light constructed according to the principles of the invention.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals represent similar parts throughout the several views of the drawings.

FIG. 1 shows a LED light constructed according to the principles of the invention. In particular, LED light 100 may include a driver printed circuit board (PCB) 102 and a power printed circuit board (PCB) 106, thermal tabs 104 and LED elements 108. This particular arrangement of a LED light 100 provides reduced material costs together with improved cooling of the light as the heat generated from LED elements 108 may be transferred to thermal tabs 104 through power PCB 106. The thermal tabs 104 have a thin cross-section, a great deal of surface area for heat transfer, and use minimal materials such as aluminum. The thermal tabs 104 are arranged such that air may flow therearound to cool the LED light 100. Moreover, the tabs 104 may be arranged as desired to provide selective heat sinking to the LED light 100. The tabs 104 may be configured with fingers 103 at one or both ends of a tab 104 for insertion into a PCB, such as power PCB 106. This particular arrangement is also well-suited for automated manufacturing process to be described below in greater detail. However, other arrangements of these components providing similar results is contemplated. For example, the tabs 104, power PCB 106, and driver PCB 102 may have any shape or configuration. Further, although the description of the invention herein is directed to LEDs, other light generating device types benefit from the same process described herein.

FIGS. 2-14 show process steps that are contemplated to be used together. However, the invention is further contemplated to use other additional steps or fewer steps as described below.

Figure 2:
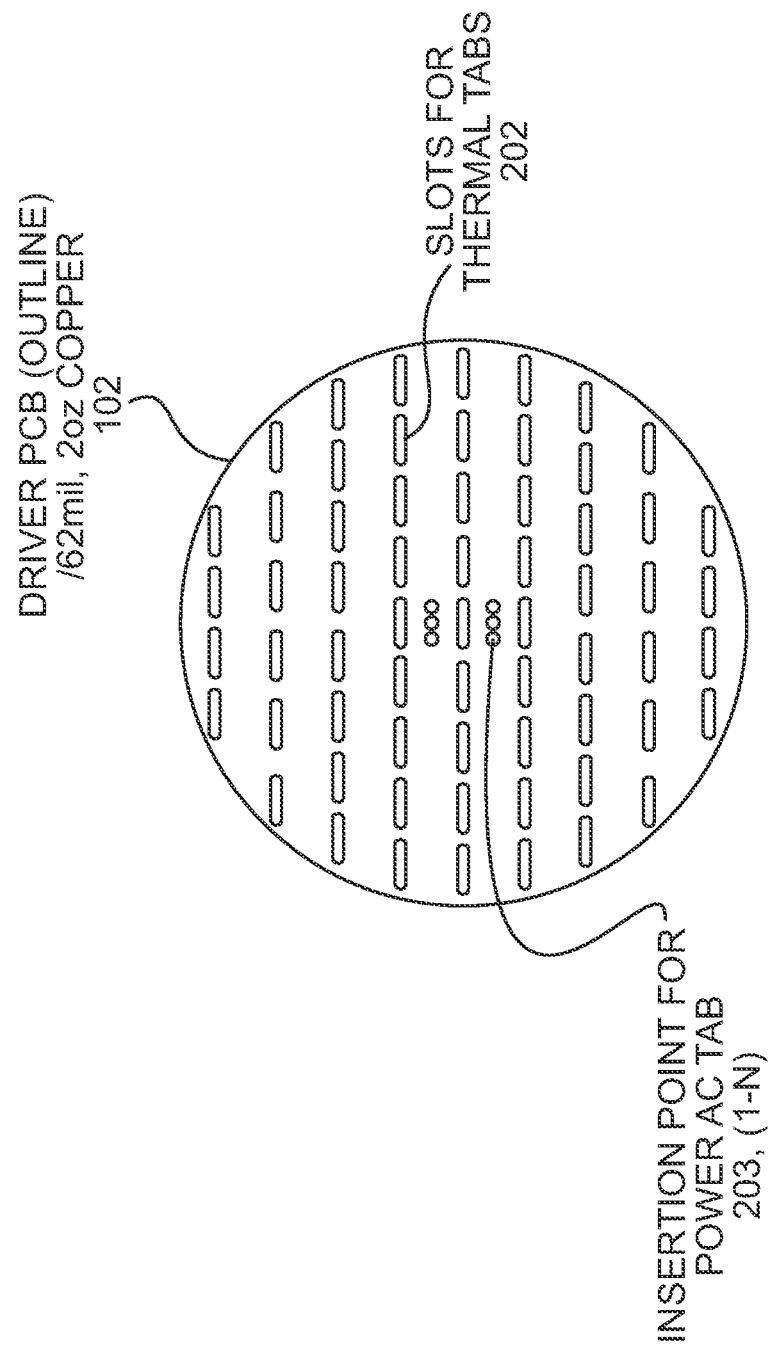
FIG. 2 shows a step of a process performed according to the principles of the invention.

FIG. 2 shows a step of a process performed according to the principles of the invention. As shown in FIG. 2, one step may be to form the driver PCB 102 by forming openings or slots 202 for the thermal tabs 104. These openings 202 may be formed by routing the driver PCB 102 or the like. The slots may be formed with a cross section dimension that is about 10%-15% larger than the thermal tab 104. Additionally, holes may be formed in the driver PCB 102 for insertion of two or more thermal tabs 104 that are dedicated for providing power to the driver PCB 102. For example, in the embodiment shown in FIG. 2, there may be at least one, preferably two or more insertion points for the power pens or tabs that may be used to provide power transfer to and within the device. Additionally, around the power tab opening 203 there may also be about 15 mils of exposed ring around the tab slot for solder. There may be one or more power tab openings 203, denoted by 1-N.

FIGS. 3A and 3B show another possible step of the process performed according to the principles of the invention. FIG. 3A is an expanded view of a driver PCB 102. In order to manufacture this particular arrangement of the driver PCB 102 or any similar arrangement that is contemplated by the invention, the driver PCB 102 may be formed with a group of others in a palletized arrangement 302 as shown in FIG. 3B. This type of arrangement may improve the automated manufacturing of the LED light 100. Additionally, the palletized arrangement 302 shown in FIG. 3 may include one or more alignment holes 304. The alignment holes 304 may help to ensure alignment with the below described palletized power PCB 106. The alignment holes 304 should be formed in a plurality to ensure a proper sustained alignment during the manufacturing process.

Figure 4:
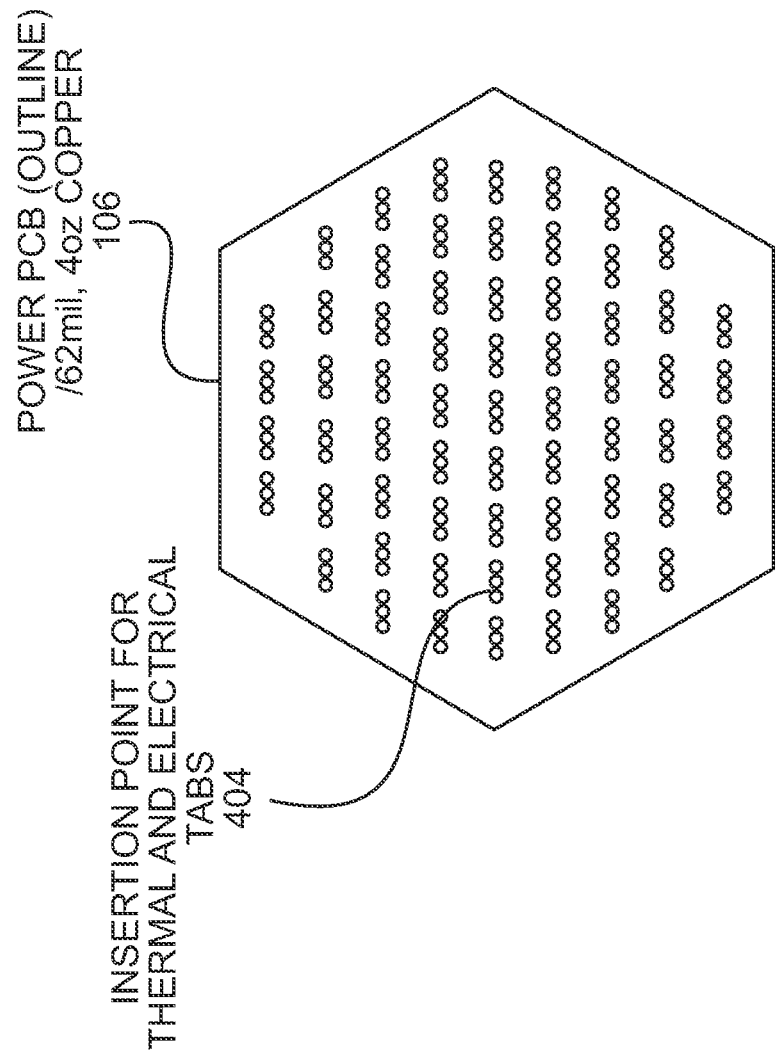
FIG. 4 shows another possible step of the process performed according to the principles of the invention.

FIG. 4 shows another possible step of the process performed according to the principles of the invention. Referring to FIG. 4, the arrangement of the power PCB 106 is shown. In particular, the power PCB 106 may be formed from 62 mil 4 oz. copper, however other sizes may be employed. Included in the power PCB 106 may be a plurality of insertion points 404 for the thermal tabs 104. In the configuration shown in FIG. 4, the thermal tabs 104 may have on one or both ends a series of one or more fingers 103 (FIG. 1 and/or FIG. 7). Accordingly, in the embodiment shown in FIG. 4, each thermal tab 104 may have three fingers and the power PCB 106 may have a corresponding number of holes for each thermal tab 104 to be inserted into. Other hole or slot arrangements are possible and contemplated by the invention herein.

Figure 5B:
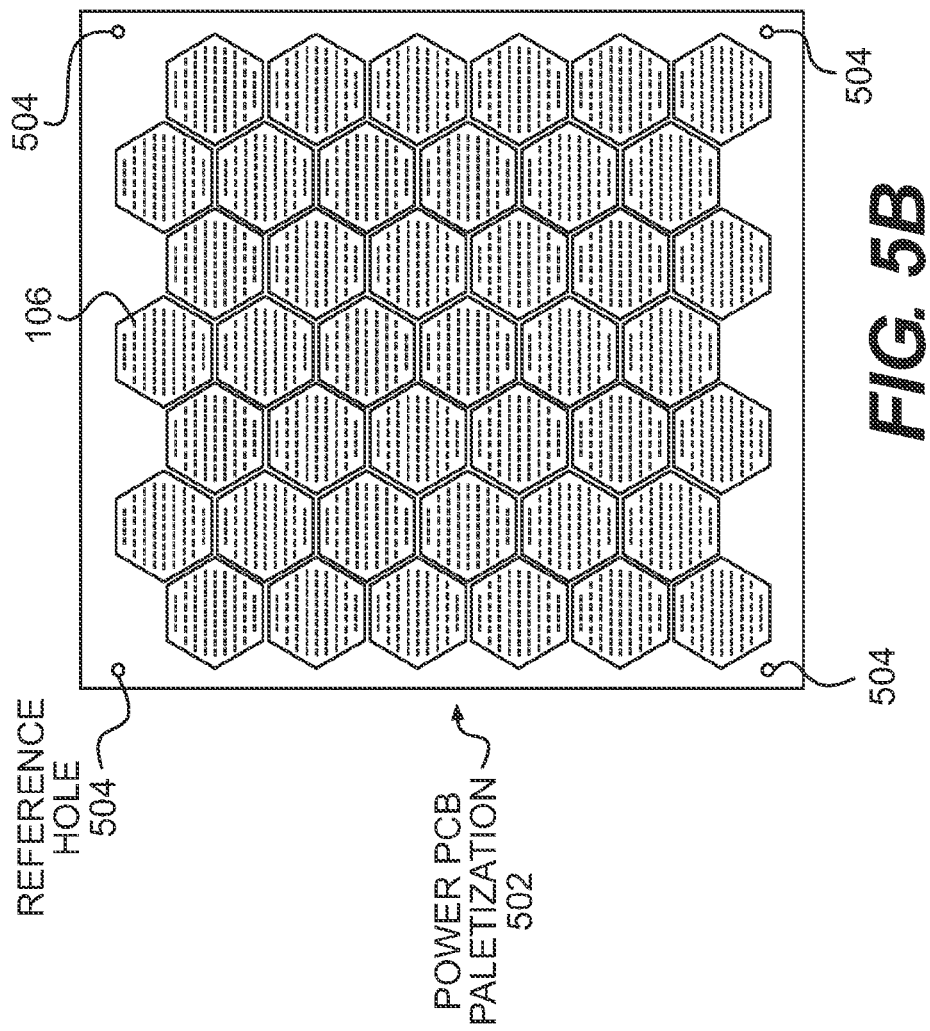
FIGS. 5A and 5B show another possible step of the process performed according to the principles of the invention.
Figure 5A:
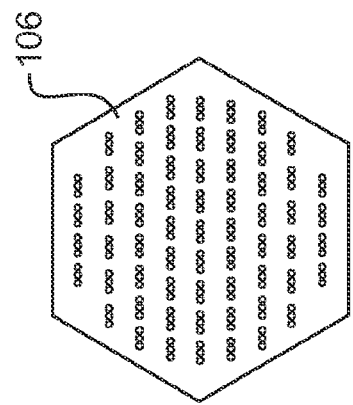

FIGS. 5A and 5B show another possible step of the process performed according to the principles of the invention. FIG. 5A is an expanded view of a power PCB 106. FIG. 5B shows the palletized arrangement that may be used with the palletized arrangement of the power PCB 106 configuration, such as shown in FIG. 1, or any other contemplated PCB. In particular, Multiple power PCBs 106 may be arranged on a single palletized structure 502 that may include reference holes 504 that may be aligned with the reference holes 304 of the driver PCB pallet 302. Again this palletized arrangement and configuration together with the alignment holes may provide increased automation capabilities along with increased quality of the final product.

FIGS. 6A and 6B show another possible step of the process performed according to the principles of the invention. FIG. 6A shows an expanded view of a driver PCB 102 with a power PCB 106, while FIG. 6B shows the alignment of the driver PCB 102 and the power PCB 106 using the reference holes 504 and 304. In this arrangement of FIG. 6B, the thermal tab insertion points on the power PCB 106 and the driver PCB 102 are aligned and the thermal tabs 104 may be inserted therethrough. In one aspect, the length of the palletized driver PCB 102 may be larger compared to the palletized power PCB 106 as shown in FIG. 6B in one dimension (i.e., width). Moreover the height of the palletized power PCB 106 may be somewhat larger than the palletized driver PCB 102. This sizing arrangement has a number of manufacturing benefits described more fully below. During manufacturing, solder may be dispensed on the palletized driver PCB 102 including the slot rings and components, if any, before the PCB alignment.

FIGS. 7A, 7B, 7C show other possible steps of the process performed according to the principles of the invention. Referring to FIG. 7A, this Figure shows an embodiment of a thermal tab 104. In particular the thermal tab 104 may include a solder finger 109 and also insertion fingers 103 as described previously. Other solder fingers and insertion fingers arrangements and designs are contemplated. Shown in FIG. 7B is the insertion of the thermal tab 104 into the power PCB 106 and the driver PCB 102. In particular, the thermal tab 104 may be inserted into the power PCB 106 where the slots on the driver PCB 102 are configured to be about 10%-15% larger than the cross section of the thermal tab 104. The larger opening of the slot for the thermal tab 104 may protect the thermal tab from hitting the driver PCB 102 while being inserted into the power PCB 106 which may be positioned on the bottom as shown in FIG. 7B. Moreover, the thermal tab 104' may be inserted into the driver PCB 102 only, at certain positions where there is no slot. This allows the thermal tab 104' to electrically connect to the driver PCB 102 as shown in FIG. 7C. These thermal tabs 104' inserted only into the driver PCB 102 may be used as a main AC (or DC) power input, or other use, such as carrying a signal.

Figure 8:
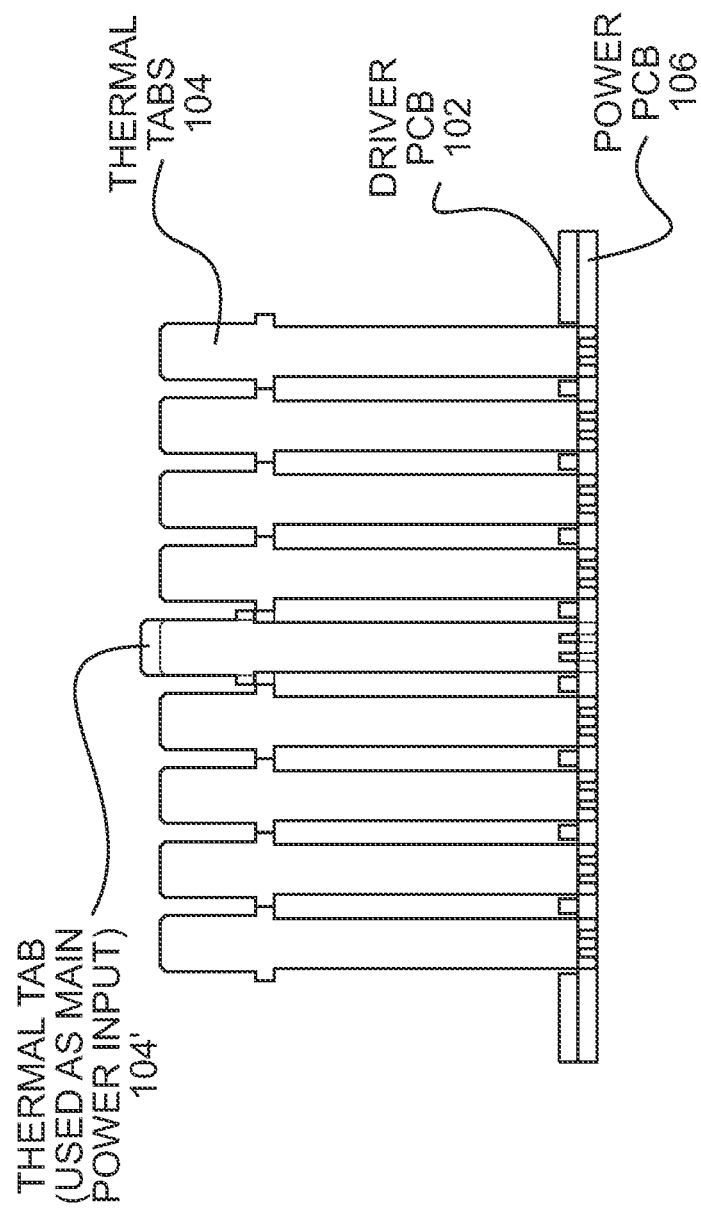
FIG. 8 shows another possible step of the process performed according to the principles of the invention.

FIG. 8 shows another possible step of the process performed according to the principles of the invention. In particular, FIG. 8 shows the arrangement of the thermal tabs 104 in both the power PCB 106 and a driver PCB 102. Again, it should be noted that at least one of the thermal tabs 104 may be used as a main power input (tall center tab 104') as indicated in FIG. 8. This tab may extend above the other thermal tabs as shown.

Figure 9C:
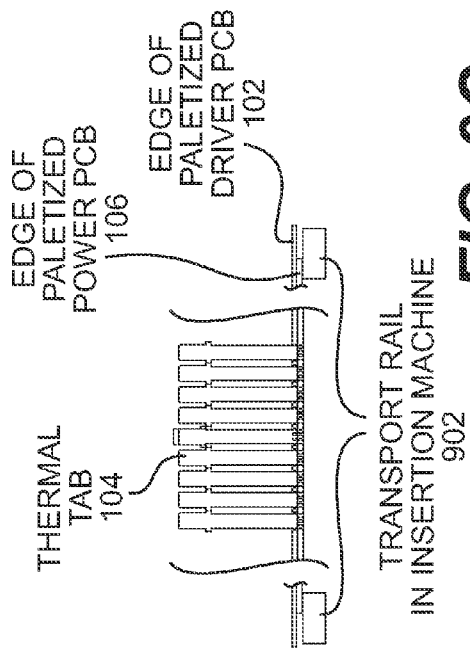
FIG. 9A-9D show other possible steps of the process performed according to the principles of the invention.
Figure 9D:
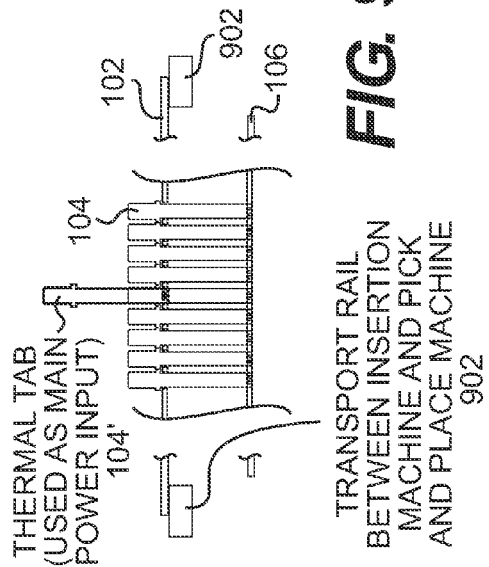
Figure 9A:
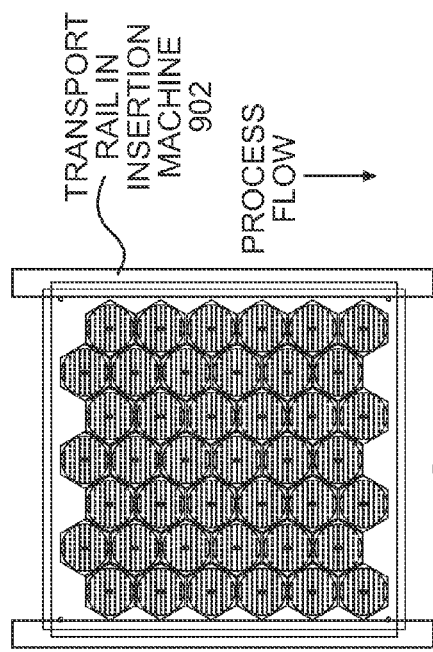
Figure 9B:
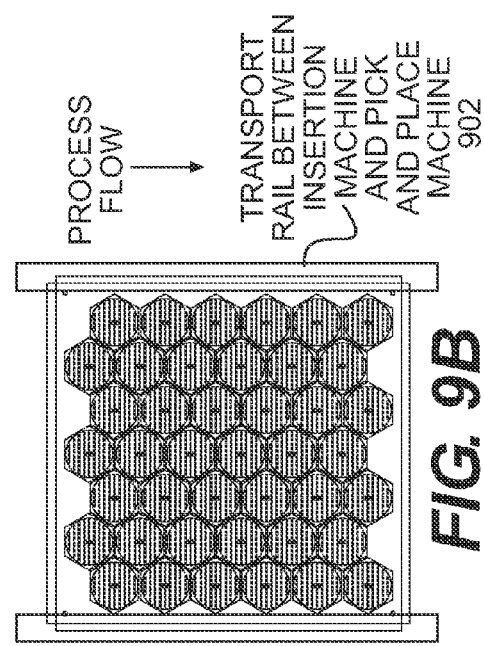

FIGS. 9A, 9B, 9C, 9D show other possible steps of the process performed according to the principles of the invention. FIG. 9A shows the palletized power PCB and palletized driver PCB of FIG. 9C on transport rails in an insertion machine for performing the insertion process as shown in relation to FIG. 9C. FIG. 9B shows the palletized power PCB and palletized driver PCB of FIG. 9D on transport rails between an insertion machine and a pick and place machine. As further shown in the sequence from FIG. 9C to FIG. 9D, the driver PCB 102 may be displaced from the power PCB 106, as will now be explained more fully. As shown in FIG. 9C, both the power PCB 106 and the driver PCB 102 may be located adjacent to each other on a transport rail 902. But as shown in relation to FIG. 9D, the two PCBs may be separated as the rail 902 is moved outwardly so as to support only the driver PCB 102. More specifically during the insertion process of FIG. 9C, both the palletized driver PCB 102 and power PCB 106 may be supported under edges of the power PCB 106. The width of the insertion conveyor belts or rails 902 may be adjusted to support the power PCB 106, which may also support the palletized driver PCB 102, as shown in FIG. 9C.

After finalizing the insertion process of FIG. 9C, the driver and power PCB 102, 106 assemblies may be transported via an inline conveyor 902 into a Surface-Mount Technology (SMT) machine. The width of the inline and SMT machine conveyor belts may then be moved or adjusted outwardly to support only the palletized driver PCB 102 and shown in FIG. 9D. At this point, the palletized power PCB 106 may no longer be supported directly by the conveyor belts or rails 902. Gravity or any other force may displace the palletized power PCB 106 shown in FIG. 9D. Solder fingers 109 as described above may limit movement of the Power PCB 106 and thus ensure proper displacement of the power PCB 106. At this time, the solder fingers 109 may actively be placed on the solder pads. Furthermore, the thermal tab 104' inserted into only driver PCB 102 may not be displaced as shown in FIG. 9D. Again, these thermal tabs 104' may be used as the main power input, or similar function.

Figure 10:
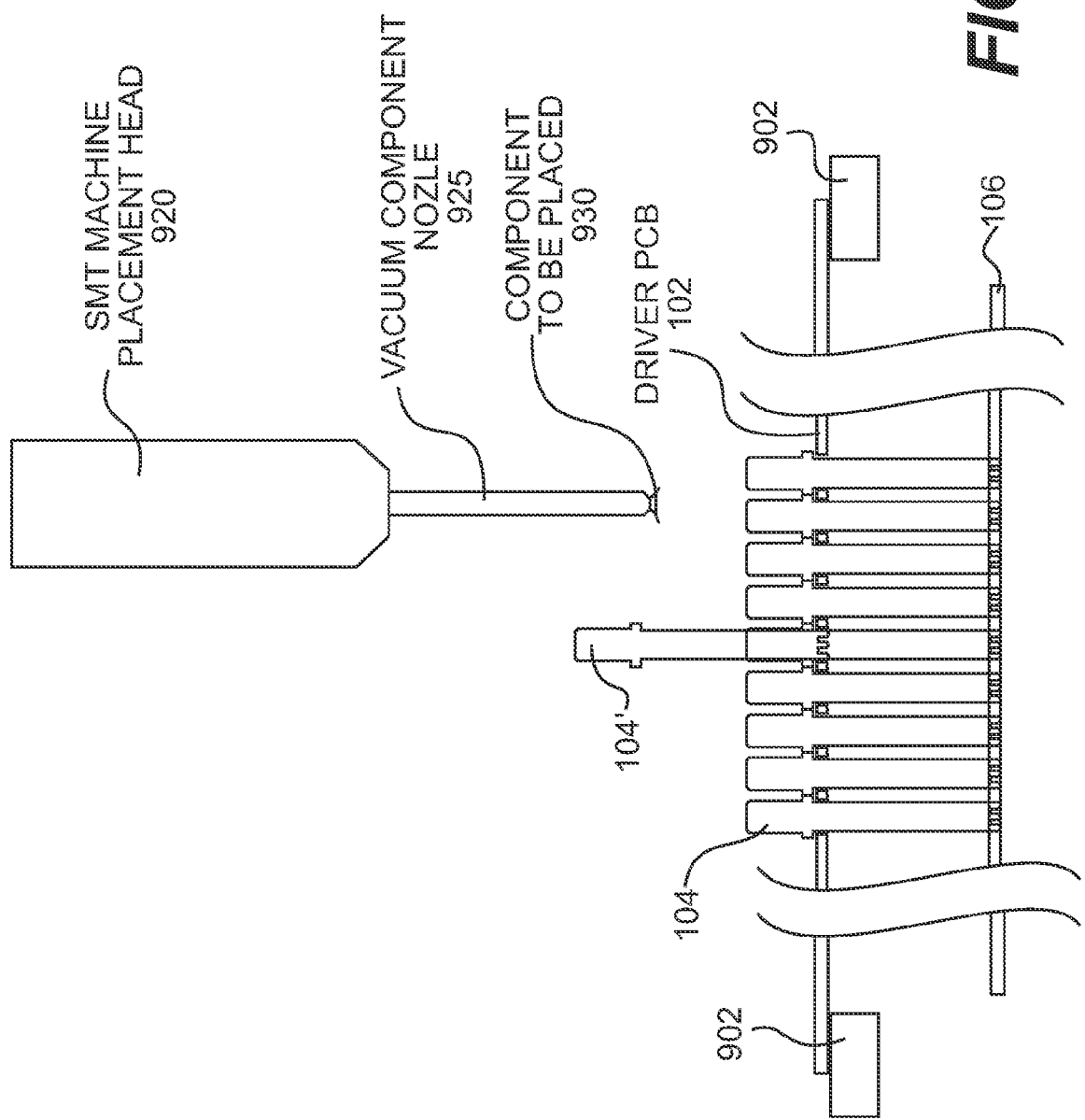
FIG. 10 shows another possible step of the process performed according to the principles of the invention.
Figure 11:
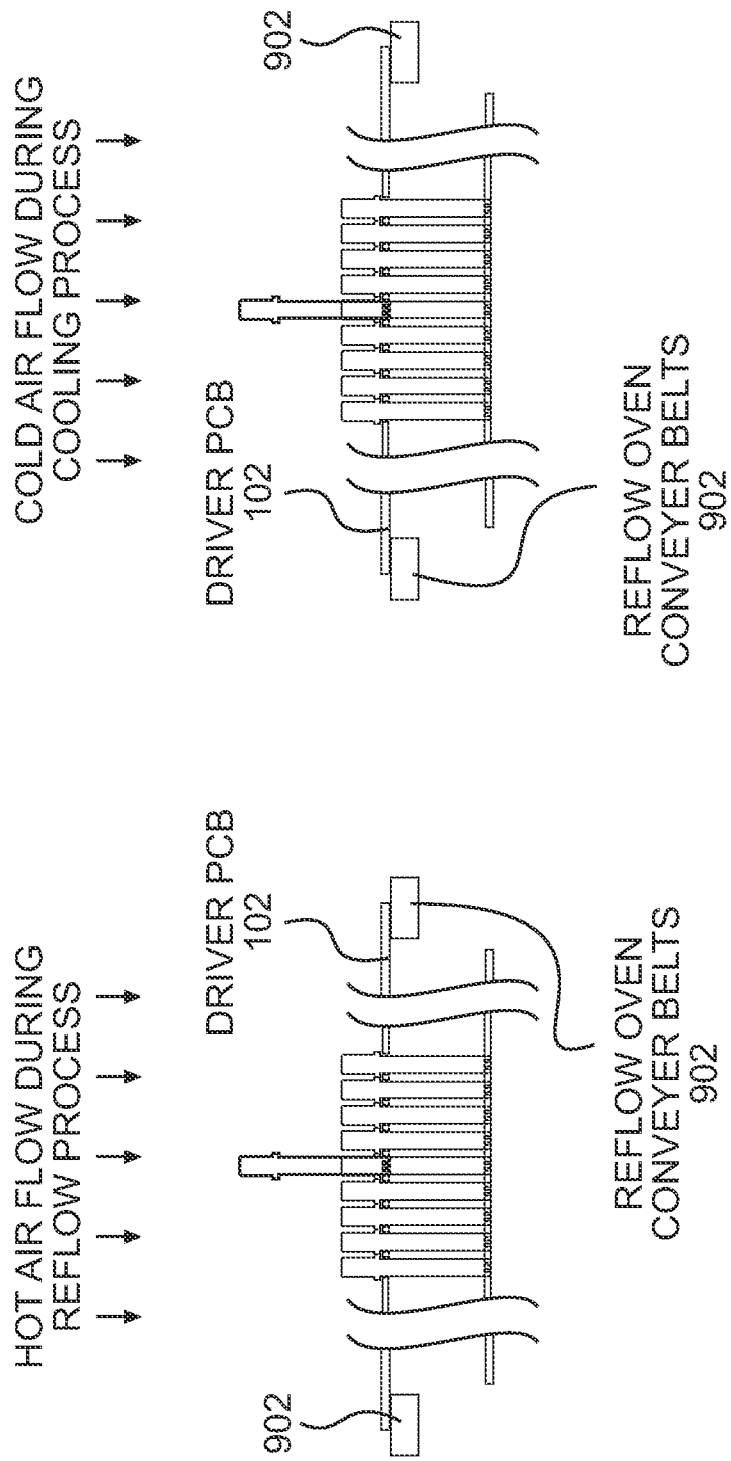
FIGS. 11A and 11B show other possible steps of the process performed according to the principles of the invention.
Figure 12:
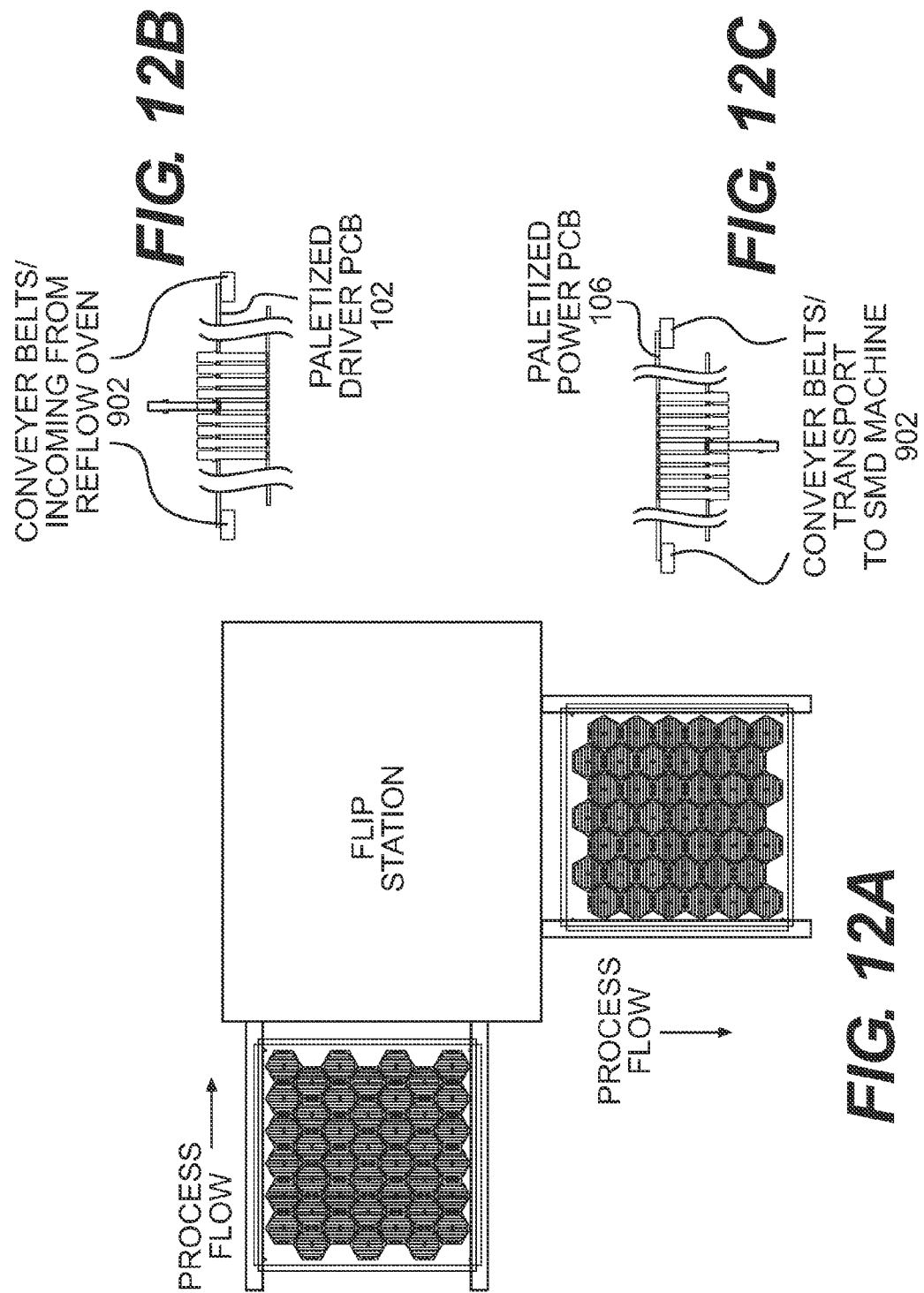
FIGS. 12A-12C show another possible steps of the process performed according to the principles of the invention.

FIG. 10 shows another possible step of the process performed according to the principles of the invention. In particular, FIG. 10 shows an exemplary component placement process on the driver PCB 102. In particular, an SMT machine may include an SMT machine placement head 920. This head may include a vacuum component nozzle 925. The vacuum component nozzle 925 may be used to generate a vacuum to hold a component 930, such as a driver component, to be placed on the driver PCB 102. During this time the SMT machine may be arranged so that it supports only the palletized driver PCB 102 edges by the rails 902. Additionally the vacuum component nozzle may be configured such that it is larger than the height of the power supply thermal tab 104' above the driver PCB 102 to ensure that the vacuum component nozzle can place the component.

FIGS. 11A and 11B show other possible steps of the process performed according to the principles of the invention. More specifically, FIGS. 11A and 11B show a first reflow process. In particular, an oven conveyor or rail 902 may be supporting the driver PCB 102. As shown in FIG. 11A, a hot air flow step may be directed during the first reflow process to allow the solder to reflow on the driver PCB surface 102. In the step of FIG. 11B, a cooling process is shown where a cold air flow may be directed at the driver PCB 102 and the power PCB 106 to cool both structures.

FIGS. 12A, 12B and 12C show other possible steps of the process performed according to the principles of the invention. In particular, FIGS. 12A, 12B and 12C show the 180 degree flip (see FIGS. 12B and 12C) and 90 degree rotation (see FIG. 12A) of the palletized assembly. In particular, during these steps of the manufacturing process, the assembly may be supported only under the edges of a palletized driver PCB board 102, as shown in FIG. 12B. In the flip station, the assembly may be flipped 180 degrees as shown from FIG. 12B to FIG. 12C. At the same time in the flip station, the assembly may also be rotated 90 degrees, as shown in relation to FIG. 12A. Now the edges of the palletized power PCB 106 extend side to side and the assembly (combined power PCB 106 and driver PCB 102) may be conveyed on those power PCB 106 edges due to the above described dimensions.

Figure 13:
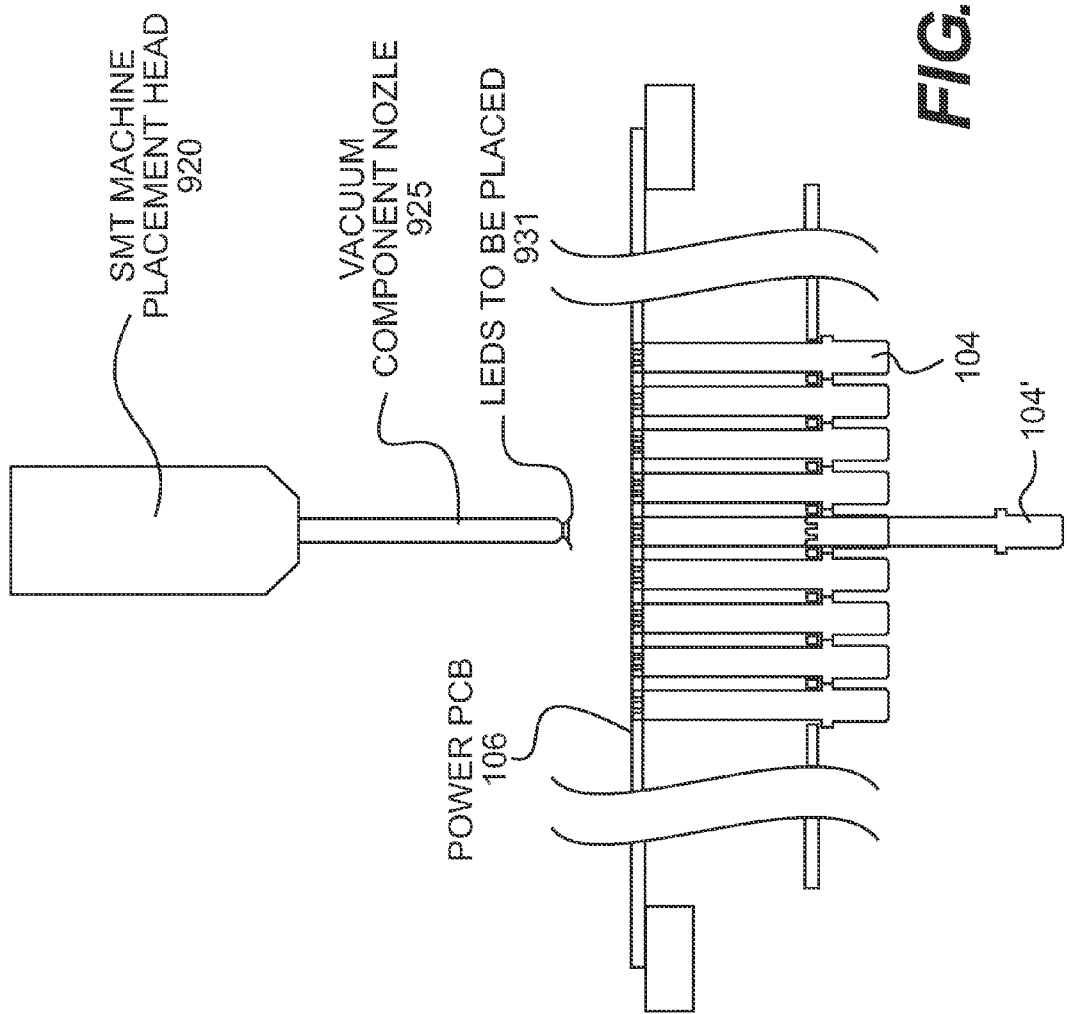
FIG. 13 shows another possible step of the process performed according to the principles of the invention.
Figure 14:
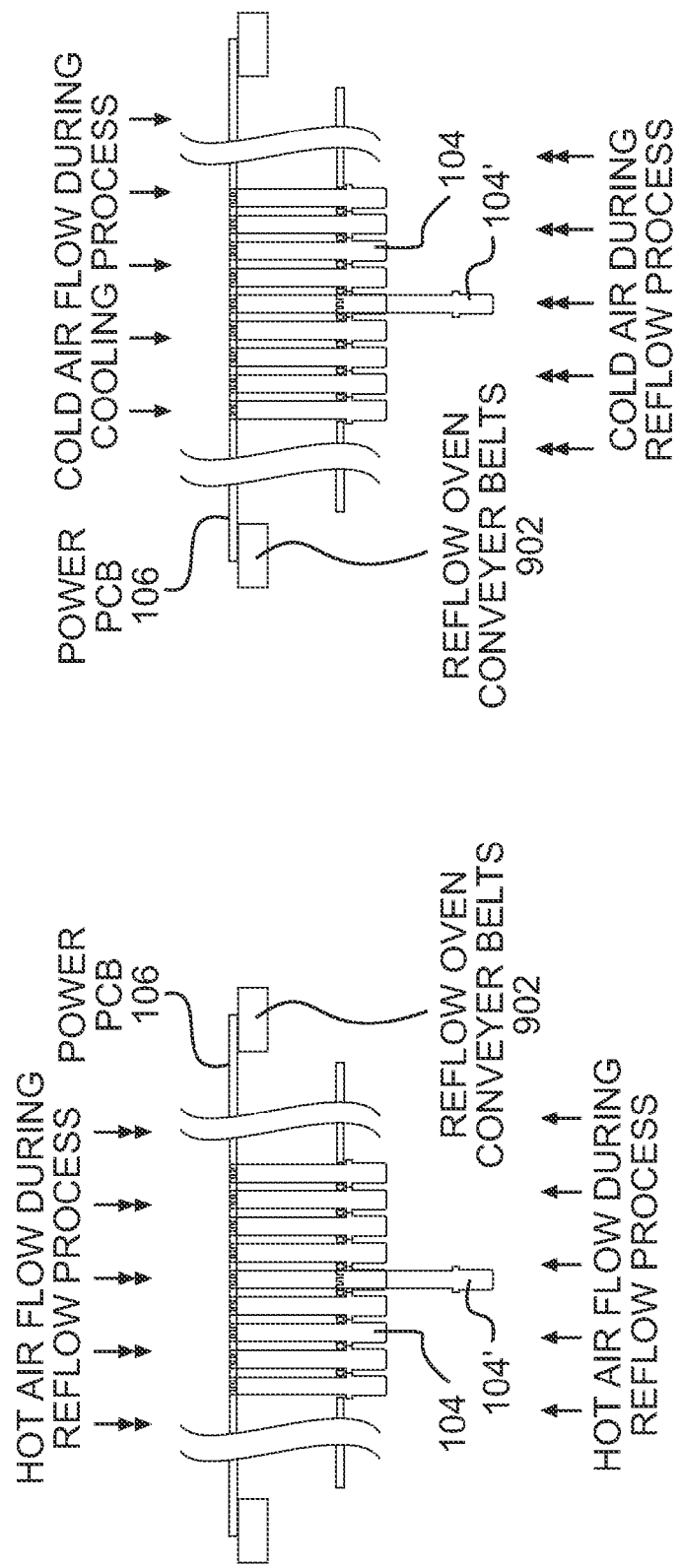
FIGS. 14A and 14B show still other possible step of the process performed according to the principles of the invention.

FIG. 13 shows another possible step of the process performed according to the principles of the invention. More specifically, FIG. 13 now shows the use of a SMT machine together with an SMT machine placement head 920 with a vacuum component nozzle 925 to attach LEDs 931 to the power PCB board 106. In particular, the SMT machine supports the palletized power PCB 106 edges and, in this regard, the LEDs are placed on the pads with previously dispensed solder.

FIGS. 14A and 14B shows still other possible steps of the process performed according to the principles of the invention. As shown in FIGS. 14A and 14B, a second reflow process may be performed. In particular, a hot air flow step during the second reflow process may be directed both to the top of the assembly and bottom of the assembly as shown in FIG. 14A. The temperature of the hot air flow to the bottom of the assembly may be adjusted not to exceed a reflow temperature of the solder used. Moreover, the temperature of the hot air flow to the top of the assembly which is the LED side, should be slightly below the recommended lead free reflow temperature. Thereafter, as shown in relation to FIG. 14B, a step of directing cold air may be performed to cool the entire assembly. The temperature of the cold air to the bottom of the assembly during the cooling process may be at least 40% lower compared to the top flow to provide improved results.

Figure 15:
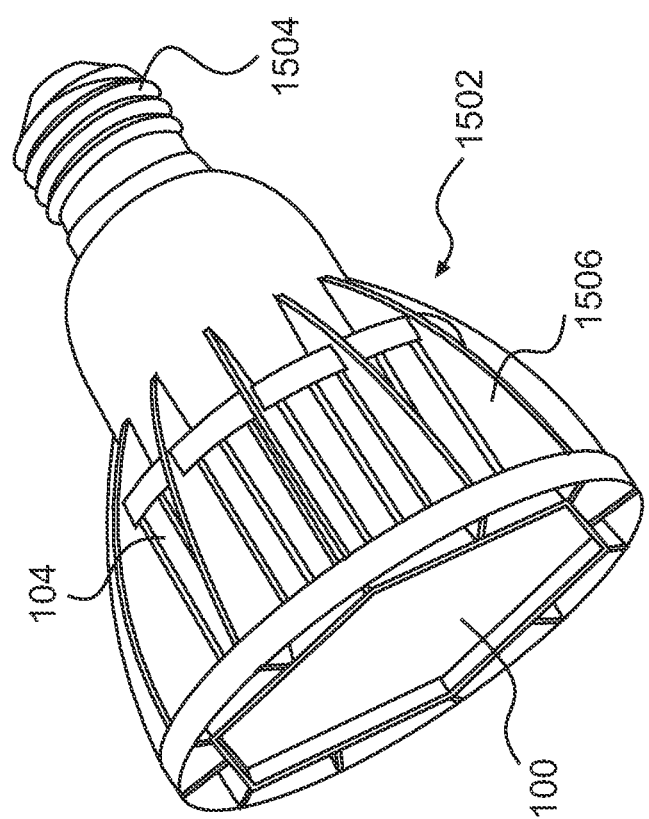
FIG. 15 shows an exemplary implementation of a light according to the principles of the invention.

FIG. 15 shows an exemplary implementation of a light according to the principles of the invention. In particular, FIG. 15 shows the LED light 100 held in a housing 1502. The housing may include a standard screw type electrical connection 1504. Other types of connections for other light arrangements are contemplated. The housing 1502 may also include an open, slotted, or fin type construction 1506 that allows air flow to the back of the LED light 100, and in particular, the thermal tabs 104. The housing 1502 may be formed of any material including synthetic materials such as plastic.

Although the lights of the invention are well-suited as light sources for homes and businesses such as shown in FIG. 15, the invention is also well-suited as light sources for computer monitors, TVs, and the like, as well as other applications.

Accordingly, the invention as described above provides a manufacturing process for LED lights that uses a reduced amount of materials, has an arrangement that can be more easily manufactured in an automated fashion and that furthermore includes other advantages. In particular, this arrangement results in selective heat sinking, no or fewer wires, no or fewer mechanical fasteners, no or less thermal grease, no or limited use of metal PCBs, no or limited hand soldering, use of heat sink components to provide power, no or fewer capacitors, and small or multiple dies. This particular arrangement is also well-suited for an automated manufacturing process. However, other arrangements of these components providing similar results is contemplated. Further, although the description of the invention herein is directed to LEDs, other light generating types benefit from one or more process steps described herein.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed:

1. A light circuit manufacturing process comprising:
   forming a palletized driver printed circuit board (PCB) having a plurality of driver PCBs;
   forming a palletized power PCB having a plurality of power PCBs;
   forming slots in the driver PCBs;
   forming holes in the power PCBs;
   aligning both the palletized power PCB and the palletized driver PCB using reference holes such that edges of each palletized PCB extend further in one direction or the other with respect to the other palletized PCB;
   inserting at least one thermal tab into both the power PCB and the driver PCB;
   arranging components on the driver PCB using an automated machine;
   performing a first reflow process;
   cooling the first reflow process;
   positioning the power PCB and driver PCB arrangement;
   placing light components on the power PCB board; and
   performing a second reflow process on the power PCB board and the light components.

2. The light circuit manufacturing process according to claim 1 wherein the positioning the power PCB and driver PCB arrangement comprises flipping and turning the power PCB and driver PCB arrangement.

3. The light circuit manufacturing process of claim 1, wherein the at least one thermal tab comprises a plurality of thermal tabs, at least one of the plurality of thermal tabs being configured as a power conductor.

4. A LED light circuit manufacturing process comprising:
   forming a palletized driver printed circuit board (PCB) having a plurality of driver PCBs;
   forming a palletized power PCB having a plurality of power PCBs;
   forming slots in the driver PCBs;
   forming holes in the power PCBs;
   aligning both the palletized power PCB and the palletized driver PCB using reference holes such that edges of each palletized PCB extend further in one direction or the other with respect to the other palletized PCB;
   inserting at least one thermal tab into both the power PCB and the driver PCB
   arranging components on the driver PCB using an automated machine;
   performing a first reflow process;
   cooling the first reflow process
   positioning the power PCB and driver PCB arrangement;
   placing LEDs on the power PCB board; and
   performing a second reflow process on the power PCB board and LED.

5. The LED light circuit manufacturing process according to claim 4 wherein the positioning the power PCB and driver PCB arrangement comprises flipping and turning the power PCB and driver PCB arrangement.

6. The LED light circuit manufacturing process of claim 4, wherein the at least one thermal tab comprises a plurality of thermal tabs, at least one of the plurality of thermal tabs being configured as a power conductor.

* * * * *